(12) United States Patent
Noh et al.

(10) Patent No.: US 10,819,372 B2
(45) Date of Patent: Oct. 27, 2020

(54) METHOD FOR DIVIDING TRANSPORT BLOCK OF LDPC CODE AND APPARATUS THEREFOR

(71) Applicant: LG Electronics Inc., Seoul (KR)

(72) Inventors: Kwangseok Noh, Seoul (KR); Bonghoe Kim, Seoul (KR); Jinwoo Kim, Seoul (KR); Ilmu Byun, Seoul (KR); Jongwoong Shin, Seoul (KR); Seunggye Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/347,508

(22) PCT Filed: Nov. 3, 2017

(86) PCT No.: PCT/KR2017/012378
§ 371 (c)(1),
(2) Date: Sep. 13, 2019

(87) PCT Pub. No.: WO2018/084617
PCT Pub. Date: May 11, 2018

(65) Prior Publication Data
US 2020/0059248 A1    Feb. 20, 2020

Related U.S. Application Data

(60) Provisional application No. 62/417,401, filed on Nov. 4, 2016.

(51) Int. Cl.
*H03M 13/15* (2006.01)
*H03M 13/11* (2006.01)
(52) U.S. Cl.
CPC ..... *H03M 13/155* (2013.01); *H03M 13/1102* (2013.01)

(58) Field of Classification Search
CPC .......... H03M 13/155; H03M 13/1102; H03M 13/116; H03M 13/618; H03M 13/09; H03M 13/2957; H03M 13/6525; H03M 13/37
See application file for complete search history.

(56) References Cited

U.S. PATENT DOCUMENTS

| | | | | |
|---|---|---|---|---|
| 2006/0206778 A1* | 9/2006 | Wehn | .................. | H03M 13/1137 714/758 |
| 2006/0206779 A1* | 9/2006 | Wehn | ................ | H03M 13/6516 714/758 |

(Continued)

FOREIGN PATENT DOCUMENTS

| | | |
|---|---|---|
| KR | 1020160030110 | 3/2016 |
| KR | 1020160106473 | 9/2016 |

(Continued)

OTHER PUBLICATIONS

M. Jiang, C. Wang, Y. Zhang and C. Zhao, "An improved variable length coding scheme using structured LDPC codes," 2010 International Conference on Wireless Communications & Signal Processing (WCSP), Suzhou, 2010, pp. 1-5. (Year: 2010).*

(Continued)

*Primary Examiner* — Cynthia Britt
(74) *Attorney, Agent, or Firm* — Fish & Richardson P.C.

(57) ABSTRACT

Disclosed are a method for dividing a transport block of a low density parity check (LDPC) code and an apparatus therefor. A method for dividing a transport block of an LDPC code according to the present disclosure can improve the performance of the LDPC code by dividing the transport block using a minimum number of code blocks. In addition, it is possible to minimize shortening bits by making the size of some of the code blocks smaller than the size of the other code blocks. Further, it is possible to prevent performance degradation due to a minimum size code block by minimiz- (Continued)

ing the number of the code blocks and performing shortening on a large size code block.

10 Claims, 12 Drawing Sheets

(56) References Cited

U.S. PATENT DOCUMENTS

| | | | | |
|---|---|---|---|---|
| 2011/0214037 | A1* | 9/2011 | Okamura | H03M 13/116 714/777 |
| 2013/0156133 | A1* | 6/2013 | Gentile | H03M 13/1111 375/340 |
| 2015/0249473 | A1* | 9/2015 | Li | H03M 13/2957 341/51 |
| 2016/0261287 | A1* | 9/2016 | Bao | H03M 13/6393 |
| 2018/0278369 | A1* | 9/2018 | Ge | H04L 1/0058 |
| 2019/0229860 | A1* | 7/2019 | Yoshimura | H04L 1/00 |
| 2020/0007161 | A1* | 1/2020 | Dikarev | H03M 13/13 |
| 2020/0021310 | A1* | 1/2020 | Zheng | H04L 1/0057 |
| 2020/0028523 | A1* | 1/2020 | Li | H03M 13/618 |
| 2020/0059248 | A1* | 2/2020 | Noh | H03M 13/618 |

FOREIGN PATENT DOCUMENTS

| | | |
|---|---|---|
| KR | 1020160106477 | 9/2016 |
| KR | 101670511 | 10/2016 |

OTHER PUBLICATIONS

Seho Myung and Kyeongcheol Yang, "Extension of quasi-cyclic LDPC codes by lifting," Proceedings. International Symposium on Information Theory, 2005. ISIT 2005., Adelaide, SA, 2005, pp. 2305-2309. (Year: 2005).*

Jeongseok Ha, Jaehong Kim, D. Klinc and S. W. McLaughlin, "Rate-compatible punctured low-density parity-check codes with short block lengths," in IEEE Transactions on Information Theory, vol. 52, No. 2, pp. 728-738, Feb. 2006. (Year: 2006).*

D. Hui, S. Sandberg, Y. Blankenship, M. Andersson and L. Grosjean, "Channel Coding in 5G New Radio: A Tutorial Overview and Performance Comparison with 4G LTE," in IEEE Vehicular Technology Magazine, vol. 13, No. 4, pp. 60-69, Dec. 2018. (Year: 2018).*

PCT International Search Report and Written Opinion in International Application No. PCT/KR2017/012378, dated Mar. 6, 2018 (with English Translation).

* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & \cdots & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

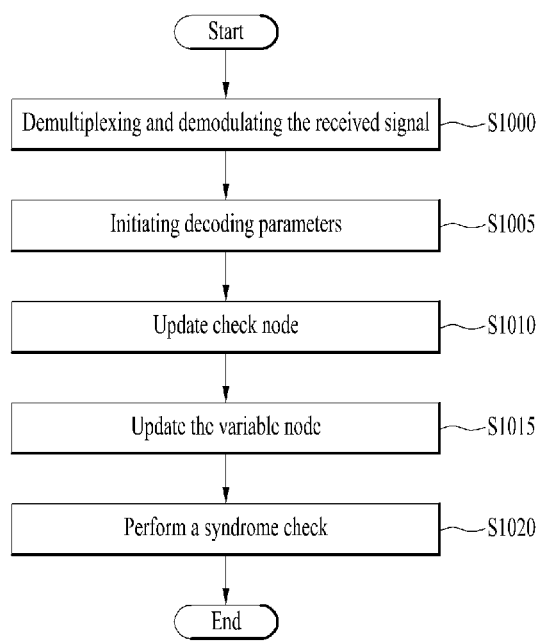

METHOD FOR DIVIDING TRANSPORT BLOCK OF LDPC CODE AND APPARATUS THEREFOR

CROSS-REFERENCE TO RELATED APPLICATIONS

This application is a National Stage application under 35 U.S.C. § 371 of International Application No. PCT/KR2017/012378, filed on Nov. 3, 2017, which claims the benefit of U.S. Provisional Application No. 62/417,401, filed on Nov. 4, 2016. The disclosures of the prior applications are incorporated by reference in their entirety.

TECHNICAL FIELD

The present invention relates to a transport block segmentation method of a channel code in a wireless communication system and, more particularly, to a transport block segmentation method of a low-density parity-check (LDPC) code and an apparatus therefor.

BACKGROUND ART

A wireless access system has been widely deployed to provide a diverse range of communication services such as a voice communication service and a data communication service. Generally, the wireless access system is a multiple access system capable of supporting communication with multiple users by sharing available system resources (e.g., bandwidth, transmit power, etc.). For example, the multiple access system may include one of a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, a multi-carrier frequency division multiple access (MC-FDMA) system, and the like.

In a broadcast system as well as in the above-described communication system, a channel code is necessarily used. As an example of a general configuration method of the channel code, a transmitter may encode an input symbol using an encoder and transmit the encoded symbol. A receiver, for example, may receive the encoded symbol and decode the received symbol, thereby recovering the input symbol. In this case, the size of the input symbol and the size of the encoded symbol may be differently defined according to a communication system. For example, in a turbo code for data information used in a 3rd generation partnership project (3GPP) long term evolution (LTE) communication system, the size of the input symbol is a maximum of 6144 bits and the size of the encoded symbol is 18432 (6144*3) bits. For turbo coding of the LTE communication system, reference is made to 3GPP technical specification 36.212.

However, even when a signal-to-noise ratio (SNR) increases, the LTE turbo code is characterized in that performance improvement is not remarkable out of a predetermined region due to the structure of the code. Regarding this problem, although use of a code having a low error rate may be considered, complexity increases.

In a communication system, a high error rate may require unnecessary retransmission of data and cause failure in channel reception. In addition, a code having excessively high complexity may increase overhead of a base station (BS) and a user equipment (UE) and cause transmission and reception latency. Especially, in a future-generation communication system requiring faster data transmission and reception, the above-described problems need to be solved. Therefore, a coding method having low complexity while lowering an error rate is demanded.

Particularly, a current LTE turbo code generates error floor as the size of information increases. Therefore, a channel coding method satisfying ultra-reliable radio (URR) and low latency radio (LLR) is needed.

DETAILED DESCRIPTION OF THE INVENTION

Technical Problems

The present invention is devised to solve the above-described problems and an object of the present invention is to provide a transport block segmentation method of an LDPC code.

Another object of the present invention is to provide an apparatus supporting the above method.

The objects desired to be achieved through the present invention are not limited to what has been particularly described hereinabove and other technical objects not described herein will be more clearly understood by persons skilled in the art from the following embodiments of the present invention.

Technical Solutions

To achieve these objects and in accordance with an aspect of the invention, a method of segmenting a transport block of a low-density parity-check (LDPC) code by a user equipment (UE) includes determining a smallest number that can divide the first block into the second blocks based on the plurality of information bit lengths; selecting a first information bit length of a smallest one of the information bit lengths capable of dividing the first block by the determined number; determining the length of the shortening bits based on the determined number, the first information bit length, and the length of the first block; determining whether the determined length of the shortening bits is less than a preset shortening bit limitation; if the determined length of shortening bits is shorter than the preset shortening bit limitation, segmenting the first block into the second blocks of the determined number, using the first information bit length; and if the determined length of the shortening bits is equal to or longer than the preset shortening bit limitation, segmenting the first block into the second blocks of the determined number, using the first information bit length and the second information bit length, by changing at least one second block among the second blocks to a size corresponding to a second information bit length among the plural information bit lengths, wherein the first block corresponds to the transport block, the second block corresponds to the code block, and the second information bit length is shorter than the first information bit length.

If the determined length of the shortening bits is shorter than the present shortening bit limitation, shortening of an equal size may be performed upon each of the second blocks, based on the determined length of the shortening bits.

If the determined length of the shortening bits is equal to or longer than the preset shortening bit limitation, shortening of an equal size may be performed only upon second blocks corresponding to the first information bit size, based on the determined length of the shortening bits.

The plural information bit lengths may be determined based on different parity check matrices.

The first block may include the transport block and a cyclic redundancy check (CRC) for the transport block, and the second block may include the code block and a CRC for the code block.

To achieve these objects and in accordance with another aspect of the invention, a user equipment (UE) includes a transceiver configured to transmit and receive a signal; a memory; and a processor configured to control the transceiver and the memory, wherein the processor is configured to determine a smallest number that can divide the first block into the second blocks based on the plurality of information bit lengths; select a first information bit length of a smallest one of the information bit lengths capable of dividing the first block by the determined number, the first information bit length, and the length of the first block; determine whether the determined length of the shortening bits is less than a preset shortening bit limitation; segment the first block into the second blocks of the determined number, using the first information bit length, if the determined length of shortening bits is shorter than the preset shortening bit limitation, and segment the first block into the second blocks of the determined number, using the first information bit length and the second information bit length, by changing at least one second block among the second blocks to a size corresponding to a second information bit length among the plural information bit lengths, if the determined length of the shortening bits is equal to or longer than the preset shortening bit limitation, wherein the first block corresponds to the transport block, wherein the second block corresponds to the code block, and wherein the second information bit length is shorter than the first information bit length.

The above-described aspects of the present invention are merely some parts of the embodiments of the present invention and various embodiments into which the technical features of the present invention are incorporated may be derived and understood by persons skilled in the art from the following detailed description of the present invention.

Advantageous Effects

Embodiments of the present invention have the following effects.

A transport block segmentation method of an LDPC code according to the present invention may minimize a shortening length.

A transport block segmentation method of an LDPC code may increase the length of a code block, thereby preventing performance degradation.

The effects that can be achieved through the present invention are not limited to what has been particularly described hereinabove and other advantages not described herein will be more clearly derived and understood by persons skilled in the art from the following embodiments of the present invention. That is, unintended effects of the present invention may also be derived by those skilled in the art from the embodiments of the present invention.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

FIG. 7 is a diagram illustrating an exemplary structured parity check matrix.

FIG. 8 is a diagram illustrating an exemplary model matrix.

FIG. 9 is a diagram referenced to explain matrix transformation according to the number of shifts.

FIG. 10 is a flowchart illustrating an exemplary LDPC code decoding method.

BEST MODE FOR CARRYING OUT THE INVENTION

The following technology may be applied to a variety of wireless access systems using code division multiple access (CDMA), frequency division multiple access (FDMA), time division multiple access (TDMA), orthogonal frequency division multiple access (OFDMA), single carrier frequency division multiple access (SC-FDMA), and the like. CDMA may be embodied through radio technology such as universal terrestrial radio access (UTRA) or CDMA2000. TDMA may be embodied through radio technology such as global system for mobile communications (GSM)/general packet radio service (GPRS)/enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802-20, and evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in downlink and SC-FDMA in uplink. LTE-advanced (LTE-A) is an evolved version of 3GPP LTE.

For clarity of description, the following description focuses on the 3GPP LTE/LTE-A system. However, the technical features of the present invention are not limited thereto. Specific terms used in the following description are provided to aid in understanding the present invention. These specific terms may be replaced with other terms within the scope and spirit of the present invention.

Figure 1:
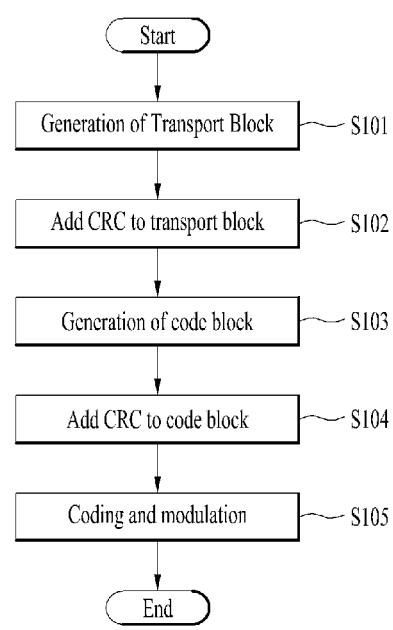
FIG. 1 is a flowchart illustrating an exemplary encoding procedure.

FIG. 1 is a flowchart illustrating an exemplary encoding procedure.

The encoding procedure as illustrated in FIG. 1 may be applied to numerous channel codes including a turbo code used in the LTE communication system. Hereinafter, for convenience of description, the encoding procedure will be described based on terms according to the standard specifications of the LTE communication system.

In the example of FIG. 1, a transmitter may generate a transport block (TB) (step S101). The transmitter adds a cyclic redundancy check (CRC) bit for the TB to the TB (step S102). The transmitter may generate code blocks from the TB to which the CRC bits are added (step S103). For example, the transmitter may segment the TB into the code blocks based on an input size of an encoder. The transmitter may add the CRC bits to each of the segmented code blocks (step S104). In this case, the size of the code block and the code block CRC bits may be 6144 bits. The transmitter may perform encoding and modulation with respect to each block which consists of a code block and code block CRC bits (step S105). For example, turbo coding may be applied as described previously.

A decoding procedure may be performed in a reverse order of the encoding procedure of FIG. 1. For example, a receiver may decode each code block using a decoder corresponding to each encoder, configure one final TB, and perform CRC confirmation for the TB.

For example, the size of an input symbol may be different from the size of a TB from a media access control (MAC) layer. If the size of the TB is greater than a maximum size of the input symbol of the turbo code, the TB may be segmented into a plurality of code blocks (CBs). According to standard of the LTE communication system, the size of the CB may be equal to a value obtained by subtracting the CRC bits from 6144 bits. The input symbol of the turbo code may be defined as data including a CB and a CRC or data including a TB (e.g., the size of the TB is less than 6144 bits) and a CRC. The CRC bits are significantly less than 6144 bits (e.g., the CRC bits are a maximum of 24 bits). Therefore, in the following description, a CB may refer to a CB itself or a CB and corresponding CRC bits and a TB may refer to a TB itself or a TB and corresponding CRC bits, unless defined otherwise).

Figure 2:
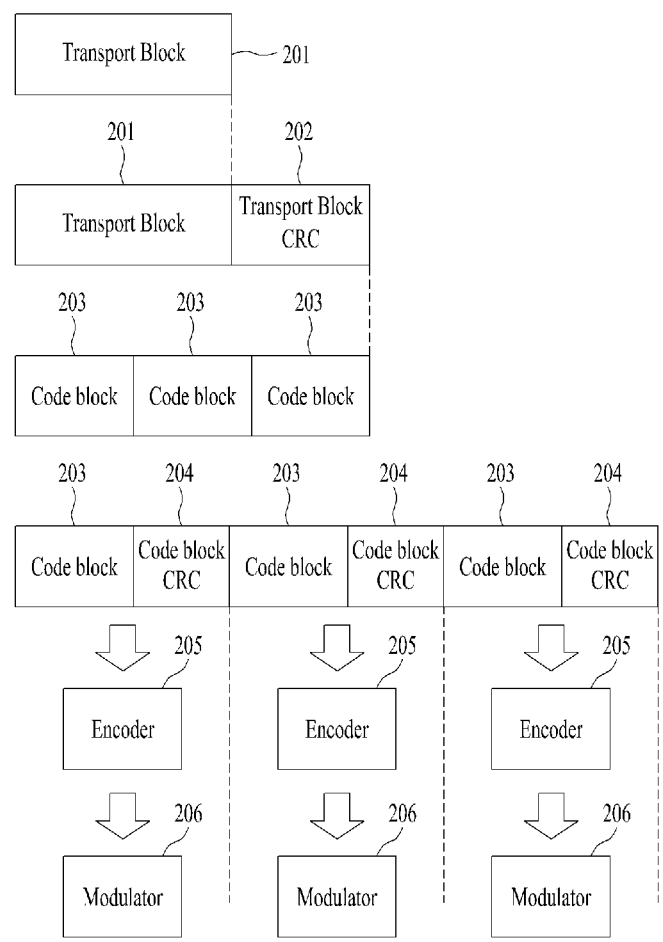
FIG. 2 is a diagram illustrating an exemplary transport block (TB) encoding procedure.

FIG. 2 is a diagram illustrating an exemplary TB encoding procedure.

FIG. 2 illustrates an encoding procedure of a TB 201 corresponding to the above-described encoding procedure in relation to FIG. 1. First, a TB CRC 202 is added to the TB 201. The TB CRC 202 may be used to confirm the TB 201 during a decoding procedure. Next, the TB 201 and the TB CRC 202 are divided into three CBs 203. In this embodiment, while the TB 201 and the TB CRC 202 are divided into the three CBs 203, the TB 201 may be divided into a plurality of CBs based on the input size of an encoder 205.

CB CRCs 204 are added to the respective CBs 203. The CB CRCs 204 may be used to confirm the CBs 203 by the receiver. The CBs 203 and the CB CRCs 204 may be encoded through respective encoders 205 and respective modulators 205.

Figure 3:
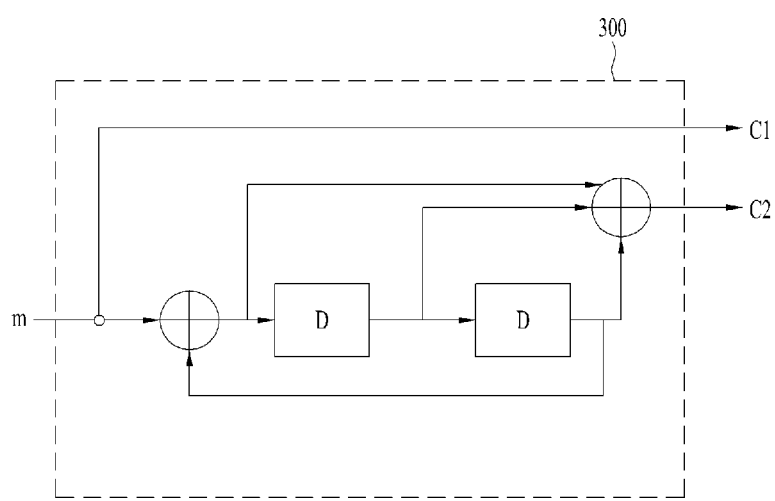
FIG. 3 is a diagram illustrating an exemplary recursive systematic convolutional (RSC) encoder.

FIG. 3 is a diagram illustrating an exemplary recursive systematic convolutional (RSC) encoder.

An RSC encoder 300 of FIG. 3 may be used for turbo coding. In FIG. 3, m denotes input data, C1 denotes a systematic bit stream, and C2 denotes a coded bit stream. Herein, the RSC encoder 300 has a code rate of 1/2.

The RSC encoder 300 may be configured by feeding back an encoded output to an input of a non-recursive, non-systematic convolutional encoder. In the embodiment of FIG. 3, the encoder 300 includes two delayers 301 and 302. A value D of each of the delayers 301 and 302 may be determined according to a coding scheme. The delayers 301 and 302 may be configured by memories or shift registers.

Figure 4:
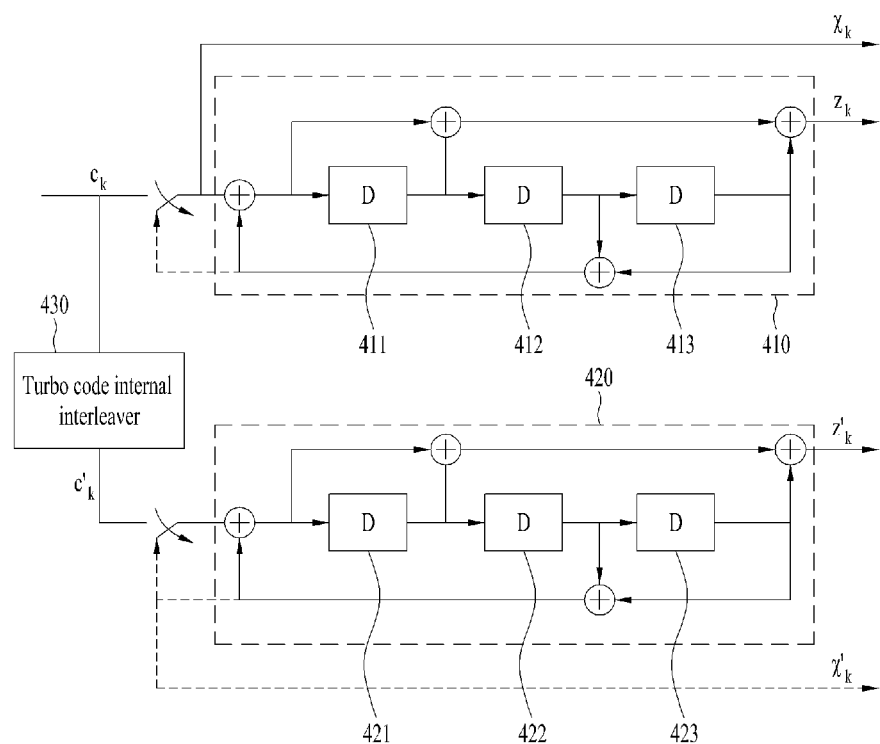
FIG. 4 is a diagram illustrating an LTE turbo encoder.

FIG. 4 is a diagram illustrating an LTE turbo encoder.

A coding scheme of an LTE turbo encoder 400 uses a parallel concatenated convolutional code (PCCC) implemented through two 8-state constituent encoders 410 and 420 and one turbo code internal interleaver 430.

In FIG. 4, the turbo encoder 400 includes the first constituent encoder 410, the second constituent encoder 420, and the turbo code internal interleaver 430. The first constituent encoder 410 and the second constituent encoder 420 are 8-state constituent encoders. Each of the first constituent encoder 410 and the second constituent encoder 420 has a structure similar to the RSC encoder of FIG. 3. The first constituent encoder 410 and the second constituent encoder 420 include three delayers 411, 412, and 413 and three delayers 421, 422, 423, respectively.

In FIG. 4, D denotes a value determined based on a coding scheme. $c_k$ denotes an input to the turbo encoder 400. Outputs from the first constituent encoder 410 and the second constituent encoder 420 are denoted as $z_k$ and $z'_k$, respectively. An output from the turbo code internal interleaver 430 is denoted as $c'_k$. Generally, each of the delayers 411, 412, 413, 421, 422, and 423 may delay an input value by one clock. However, each of the delayers 411, 412, 413, 421, 422, and 423 may be configured to delay the input value by more than one clock according to internal configuration. Each of the delayers 411, 412, 413, 421, 422, and 423 may be comprised of a shift register and may be configured so as to delay an input bit by a preset clock and then output the input bit therethrough.

The turbo code internal interleaver 430 may reduce an effect of a burst error which may be generated during signal transmission on a radio channel. For example, the turbo code internal interleaver 430 may be a quadratic polynomial permutation (QPP) interleaver.

A turbo code is a high-performance forward error correction (FEC) code used in the LTE communication system. For example, a data block coded by the turbo code may include three subblocks. One subblock may correspond to m-bit payload data. Another subblock may include n/2 parity bits for a payload, calculated using an RSC code. In addition, the other subblock may include n/2 parity bits for permutation of payload data, calculated using the RSC code. For example, the above permutation may be performed by the interleaver. Accordingly, the two different subblocks of parity bits may constitute one block together with the subblock for the payload. As an example, when m is equal to n/2, one block has a code rate of 1/3.

In the first constituent encoder 410, a procedure in which the input $c_k$ reaches the encoded bit $z_k$ may be divided into two paths. The two paths include a first path connected to an output stage from an input stage without feedback and a second path fed back from the input stage back to the input stage.

On the first path, the input $c_k$, the input $c_k$ passing through the delayer 411, and the input $c_k$ passing through the delayers 411, 412, and 413 are supplied to the output stage. A relationship between the input stage and the output stage for the first path may be expressed as a polynomial. The polynomial for the first path is referred to as a forward generator polynomial and may be expressed as g1 of the following equation indicated below.

$$g1(D)=1+D+D^3 \qquad \text{[Equation 1]}$$

Meanwhile, on the second path, the input $c_k$, the input $c_k$ passing through the delayers 411 and 142, and the input $c_k$ passing through the delayers 411, 412, and 413 are fed back to the input stage. A polynomial for the second path is referred to as a recursive generator polynomial and may be expressed as g0 of the following equation indicated below.

$$g0(D)=1+D^2+D^3 \quad \text{[Equation 2]}$$

In Equations 1 and 2, "+" denotes exclusive OR (XOR) and 1 represents that an input is subjected to delay zero times. In addition, $D^n$ represents that an input is subjected to delay n times.

Figure 5:
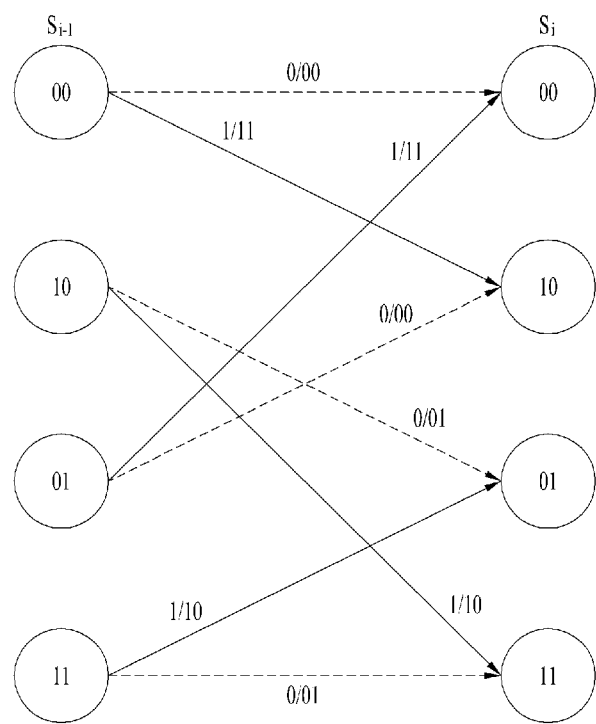
FIG. 5 is a diagram illustrating an exemplary trellis according to an RSC encoder.

FIG. 5 is a diagram illustrating an exemplary trellis according to an RSC encoder.

FIG. 5 illustrates the structure of the trellis of the RSC encoder of FIG. 3. In FIG. 5, $S_i$ denotes a state of i-th input data. In FIG. 5, each circle denotes a node. A line between nodes denotes a branch. A branch of a real line means a branch for an input value 1 and a branch of a dotted line means a branch for an input value 0. A value on the branch is expressed as m/C1C2 (input value/systematic bit, encoded bit). The trellis may have states exponentially proportional to the number of memories of the encoder. For example, if the encoder includes a memories, $2^a$ states may be included in the trellis.

The trellis is a state machine illustrating state transition of an encoder allowable two states. A convolutional encoder such as the RSC encoder may perform encoding according to a trellis diagram. A codeword encoded by the RSC encoder may be decoded according to an algorithm based on a trellis structure. For example, a Viterbi or Bahl, Cocke, Jelinek and Raviv (BCJR) algorithm may be used.

Figure 6:
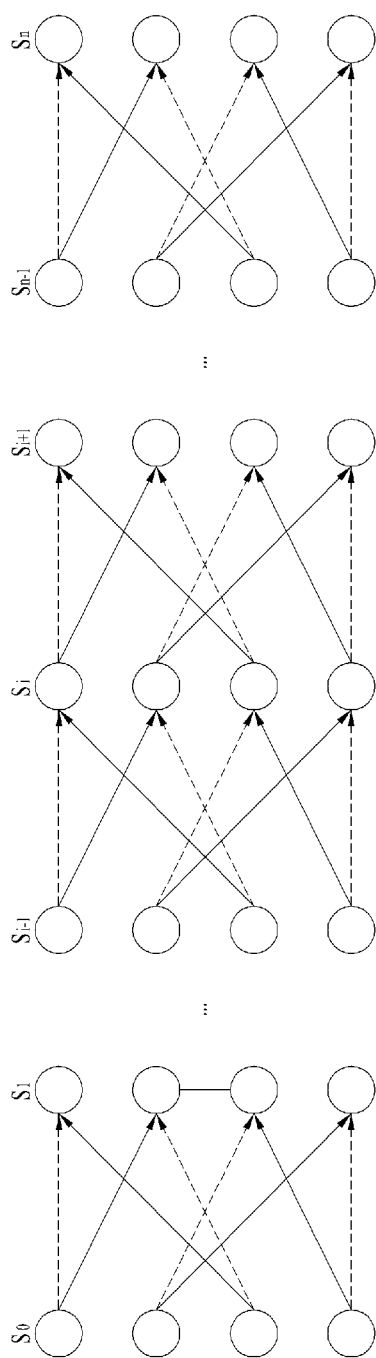
FIG. 6 is a diagram illustrating an exemplary trellis structure.

FIG. 6 is a diagram illustrating an exemplary trellis structure.

In FIG. 6, n denotes the length of a codeword. Typically, additional bits are added to the end of an input sequence, thereby terminating a trellis. Generally, a sequence consisting of 0s is referred to as tail bits. The tail bits terminate the trellis by causing nodes of one state of the trellis to have a value of 0.

In FIG. 6, the length of the codeword may be determined in consideration of the length k of input data and the length t of tail bits. For example, when a code rate is R, the length n of the codeword may have a value of (k+t)/R. Generally, the length t of the tail bits may be determined as a length with which all delays (e.g., memories) of an encoder can be reset. As an example, the RSC encoder of FIG. 3 may use a total of two tail bits. In addition, the turbo encoder of LTE communication as illustrated in FIG. 4 may use three tail bits.

The tail bits have a relatively short length as compared with the length of input data. As described above, since the length of the codeword is associated with the length of the tail bits, if the length of the codeword is limited, code rate loss may occur due to the tail bits. However, although code rate loss is generated due to the tail bits, trellis termination using the tail bits is widely used because of low complexity of calculation and excellent error correction performance.

Puncturing is a scheme of puncturing a part of codewords. Through puncturing, since a part of codewords is punctured, partial codewords are not transmitted. For example, puncturing may be used to reduce code rate loss caused by addition of the tail bits. In this case, a receiver may perform decoding using a trellis corresponding to the sum of the length k of the input data and the length t of the tail bits. That is, the receiver may perform decoding under the assumption that the receiver has received codewords which are not punctured. In this case, the receiver may regard a branch from a node corresponding to a punctured bit (i.e., a bit which is not transmitted by a transmitter) as having no input value. That is, it is assumed that the input data for branches of a corresponding node is 0 or 1 with the same possibility.

As described above in relation to FIG. 1, a CRC for a CB is added to the CB. The CRC may be determined as a remainder derived after data to be transmitted is divided by a preset check value used as a divisor. Generally, the CRC may be added to the end of the transmission data. The receiver may compare the remainder after reception data is divided by the preset check value with the CRC or determine whether a remainder after entire reception data including the CRC is divided by the check value is 0.

If the size of a TB is 6144 bits, the size of the CRC may be a maximum of 24 bits. Accordingly, the other bits except for the CRC bits may be determined as the size of the CB.

The receiver may perform decoding with respect to each CB. Thereafter, the receiver may configure the TB from CBs and determine whether decoding has been successfully performed by checking the CRC for the TB. In a current LTE system, a CB CRC is used for early decoding termination. For example, if a CRC for one CB fails, the receiver may not decode the other CBs and transmit a negative acknowledgement (NACK) to the transmitter.

Upon receiving NACK, the transmitter may retransmit at least a part of transmission data. For example, the transmitter may retransmit a TB or one or more CBs. As an example, when the transmitter retransmits all of the TB, radio resources for retransmission may be excessively consumed. In addition, for example, when the receiver generates NACK due to failure of a CB CRC, the receiver may transmit information about a CB (e.g., an index of a CB) in which CRC failure has occurred to the transmitter. The transmitter may increase the efficiency of radio resources by transmitting only the CB in which CRC failure has occurred using the information about the CB. However, if the number of CBs increases, the amount of data for feeding back the information about the CBs (e.g., indexes of the CBs) increases.

In the LTE communication system, the receiver may inform the transmitter through an ACK/NACK signal whether data has been successfully received. In the case of frequency division duplex (FDD), ACK/NACK for data received in an i-th subframe is transmitted in an (i+4)-th subframe. If NACK is received in the (i+4)-th subframe, retransmission may be performed in an (i+8)-th subframe. This is to consider a time for processing the TB and a time for generating ACK/NACK because channel code processing for processing the TB consumes much time. In the case of time division duplex (TDD), ACK/NACK and retransmission subframes may be determined based on a time for processing the TB, a time for generating ACK/NACK, and uplink subframe allocation (e.g., TDD uplink/downlink configuration). In addition, ACK/NACK bundling and multiplexing may be used.

As described above, the turbo code shows restricted improvement in an error rate if an SNR exceeds a predetermined value. As an alternative to the turbo code, a low-density parity-check (LDPC) code has been proposed. The LDPC code is a linear block code and is used in IEEE 802.11n and 802.11ac and digital video broadcasting (DVB). The LDPC code may include a generation matrix and a parity check matrix. In the LDPC code, data may be encoded through a multiplication operation of message bits and the generation matrix. Generally, in communication specification using the LDPC code, the parity check matrix may be used instead of the generation matrix. For example, data may be encoded using the parity check matrix.

The linear block code may be generated based on a generation matrix G or a parity check matrix H. The linear block code is configured such that the product $Hc^t$ of a transpose matrix of a codeword c and the parity check matrix has a value of 0 with respect to the whole codeword c. Decoding of the LDPC code may be performed, as identical to other linear block codes, by checking whether the product of the parity check matrix H and the codeword c is '0'. For example, decoding of the LDPC code may be performed by checking whether the product (i.e., $Hc^t$) of a transpose matrix of the codeword c and the parity check matrix is 0.

In the LDPC code, most elements of the parity check matrix are 0 and there are a small number of elements having values other than 0 as compared with the length of the code. Therefore, the LDPC code may perform iterative decoding based on probability. In an initially proposed LDPC code, the parity check matrix has been defined in a non-systematic form and a small weight has been uniformly applied to rows and columns of the parity check matrix. A weight may mean the number of 1s included in a row or a column.

As described above, the density of elements having values other than 0 in a parity check matrix H of the LDPC code is low. Accordingly, the LDPC code has performance approximating to limits of Shannon's theorem while decoding complexity is kept low. Due to high error correction performance and low decoding complexity of this LDPC code, the LDPC code is suitable for high-speed wireless communication.

Hereinafter, a structured LDPC code will be described.

Figures 7, 8:
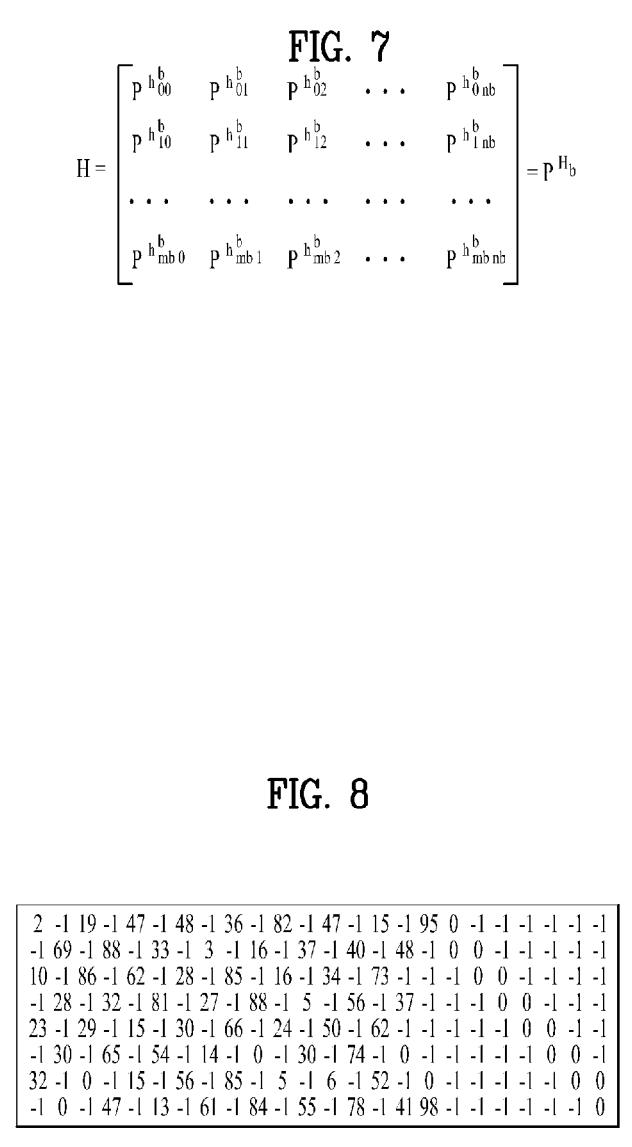

As described previously, the parity check matrix H may be used to generate the LDPC code. The matrix H includes a large number of 0s and a small number of 1s. The size of the matrix H may be $10^5$ bits or more. Many memories may be needed to express the H matrix. In the structured LDPC code, elements of the matrix H may be expressed as subblocks of a predetermined size as illustrated in FIG. 7. In FIG. 7, each of the elements of the matrix H represents one subblock.

In the IEEE 802.16e standard specification, a subblock is indicated by one integer index, so that the size of memories for expressing the matrix H may be reduced. Each subblock may be, for example, a permutation matrix of a predetermined size.

FIG. 8 is a diagram illustrating an exemplary model matrix.

For example, referring to the IEEE 802.16e standard specification, if the size of codewords is 2304 and a code rate 2/3, a model matrix used to encode/decode the LDPC code is as illustrated in FIG. 8. The model matrix may mean a parity check matrix including at least one subblock described below. The subblock may be referred to as the number of shifts in the following description. The model matrix may be extended to the parity check matrix based on a method which will be described later. Therefore, encoding and decoding based on a specific model matrix means encoding and decoding based on a parity check matrix generated by extending the model matrix.

In FIG. 8, index '−1' indicates a zero matrix of a preset size. Index '0' indicates an identity matrix of a preset size. A positive index except for '−1' and '0' indicates the number of shifts. For example, a subblock expressed as index '1' may mean a matrix obtained by shifting an identity matrix once in a specific direction.

FIG. 9 is a diagram referenced to explain matrix transformation according to the number of shifts.

For example, FIG. 9 illustrates the case in which the size of a subblock is 4 rows and 4 columns. In FIG. 9, the subblock is shifted from an identity matrix three times to the right. In this case, in a parity check matrix of a structured LDPC code, the subblock may be represented using an integer index of '3'.

Generally, encoding of the LDPC code may be performed by generating a generation matrix G from a parity check matrix H and encoding information bits using the generation matrix. To generate the generation matrix G, Gaussian reduction is performed with respect to the parity check matrix H to configure a matrix in the form of $[P^T: I]$. If the number of the information bits is k and the size of encoded codewords is n, a matrix P is a matrix including k rows and n-k columns and a matrix I is an identity matrix having a size of k.

If the parity check matrix H has the form of $[P^T: I]$, the generation matrix G has a form of $[I: P^T]$. If k information bits are encoded, the encoded information bits may be expressed as a matrix x of one row and k columns. In this case, a codeword c is xG having a form of [x: xP]. Herein, x denotes an information part (or a systematic part) and xP denotes a parity part.

In addition, the information bits may be encoded directly from the matrix H without deriving the matrix G by designing the matrix H as a specific structure without using Gaussian reduction. For the structures of the above-described matrix H and matrix G, the product of the matrix G and a transpose matrix of the matrix H has a value of 0. Using such a characteristic and a relationship between the information bits and the codeword, the codeword may be obtained by adding parity bits to the end of the information bits.

FIG. 10 is a flowchart illustrating an exemplary LDPC code decoding method.

In a communication system, encoded data includes noise in a process of passing through a radio channel. Accordingly, a codeword c is expressed as a codeword c' including noise in a receiver. The receiver performs demultiplexing and demodulation with respect to a received signal (step S1000) and initializes decoding parameters (step S1005). The receiver updates a check node and a variable node (steps S1010 and S1015) and performs syndrome check (step S1020). That is, a decoding procedure may be ended by checking whether $c'H^T$ is 0. If $c'H^T$ is 0, the first k bits from c' may be determined as the information bits x. If $c'H^T$ is not 0, the information bit x may be recovered by searching for c' satisfying the condition that $c'H^T$ is 0 based on a decoding scheme such as a sum-product algorithm.

Figure 11:
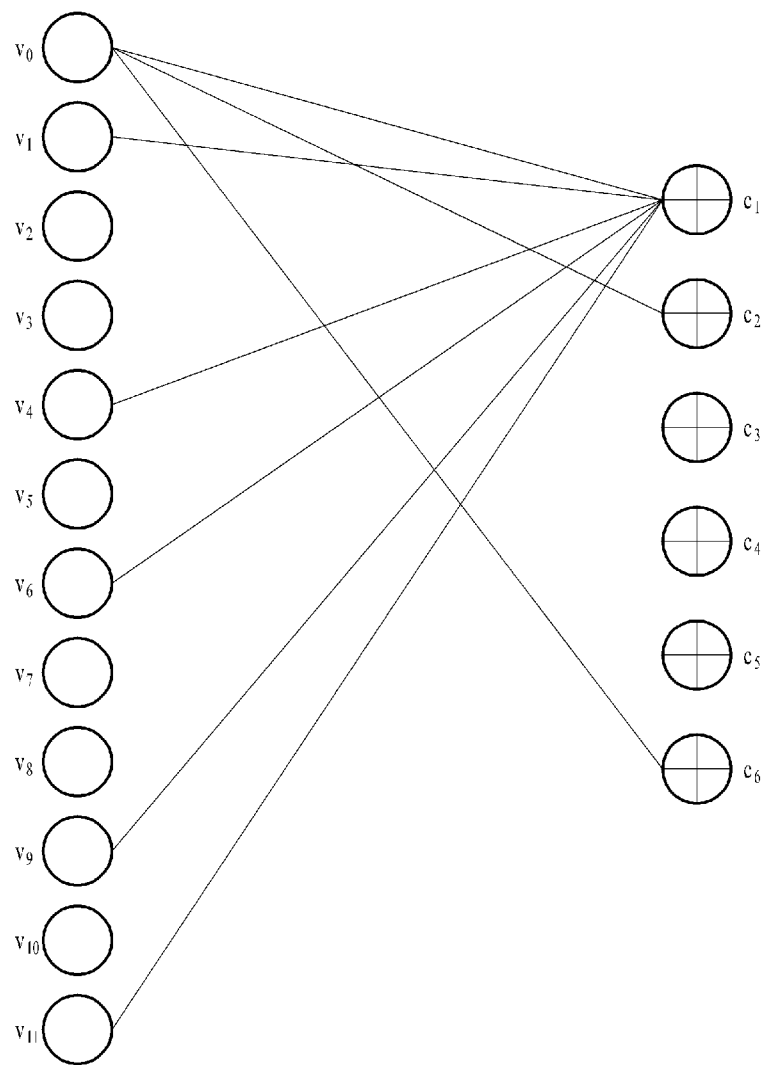
FIG. 11 is a diagram illustrating an exemplary bipartite graph.

FIG. 11 is a diagram illustrating an exemplary bipartite graph.

In FIG. 11, left nodes $v_0, v_1, \ldots, v_{11}$ represent variable nodes and right nodes $c_1, c_2, \ldots, c_6$ represent check nodes. In the example of FIG. 11, a bipartite graph is illustrated focusing on the variable node $v_0$ and check node $c_1$ for convenience of description. Connection lines of the bipartite graph of FIG. 11 may be referred to as edges. The bipartite graph of FIG. 11 may be generated from $Hc^t$. Therefore, in FIG. 11, edges from the variable node $v_0$ correspond to the first column of the parity check matrix H and edges from the check node $c_1$ correspond to the first row of the matrix H.

As described above, in order to successfully perform decoding, the product of the parity check matrix H and a transpose matrix of the codeword matrix c should have a value of '0'. Accordingly, values of variable nodes connected to one check node should be 0. Consequently, in FIG. 11, values of exclusive OR (XOR) of the variable nodes $v_0$, $v_1$, $v_4$, $v_6$, $v_9$, $v_{11}$ connected to the check node c1 should be '0'. Syndrome check means checking as to whether a value of XOR of variable nodes connected to each check node is 0.

In an enhanced mobile broadband (eMBB) communication environment, the LDPC code may be used. For example, the LDPC code may be used for a data channel. In relation thereto, an LDPC code decoding method code using syndrome check instead of CRC has been proposed. However, when syndrome check is performed during repeated decoding, a memory in which a log likelihood ratio for variable nodes is stored needs to be read every time for syndrome check. Therefore, power consumption and latency caused by memory reading may increase.

A sum-product algorithm is used as a standard decoding algorithm for a capacity-approaching code (e.g., a turbo code or an LDPC code). As a decoding method using the sum-product algorithm, a belief propagation algorithm is used. In a layered belief propagation algorithm, operations for check nodes and variable nodes of the sum-product algorithm are sequentially processed for decoding of the LDPC code. Therefore, in the layered belief propagation algorithm, a probability value of the first variable node is transferred to check nodes connected to the first variable node and an additional information value calculated based on the probability value transferred to each check node is transferred to variable nodes connected to each check node. Update for the other variable nodes is sequentially performed based on the transferred additional information value. Thus, probability values for all variable nodes may be updated.

Due to sequential update of the variable nodes the layered belief propagation algorithm, a probability value of an already updated variable node may be used for update of a specific variable node. However, decoding using the layered belief propagation algorithm is disadvantageous in that a decoding time increases relative to a flooding belief propagation algorithm by the length of a codeword. For example, the decoding time may increase by N times the length of the codeword.

Figure 12:
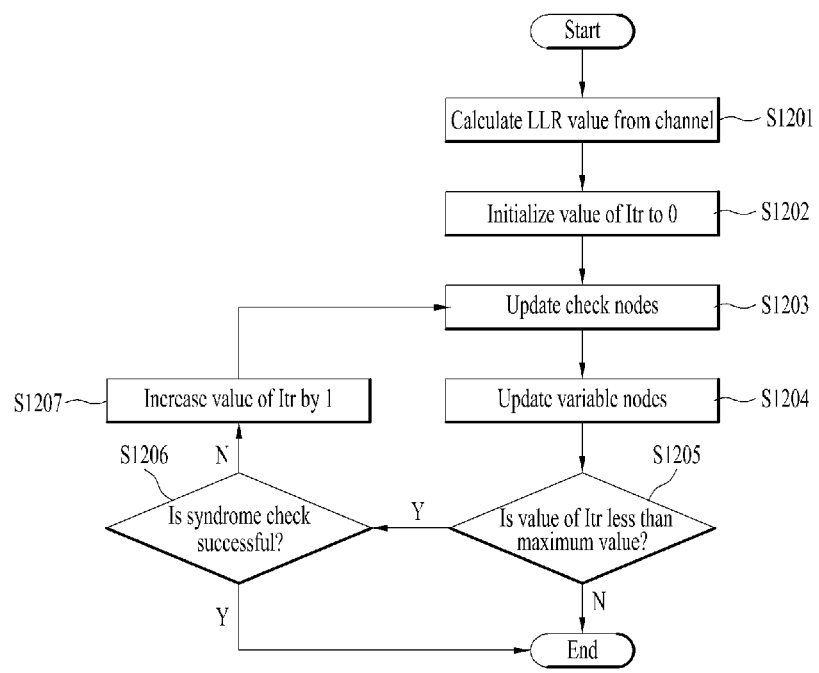
FIG. 12 illustrates an exemplary LDPC code decoding method using syndrome check.

FIG. 12 is a flowchart of an exemplary LDPC code decoding method using syndrome check.

A receiver calculates a log likelihood ratio (LLR) value from a channel (S1201). For example, the receiver may calculate an LLR value of a received input signal or a codeword. Although not illustrated in FIG. 12, the receiver may initialize variable nodes using the LLR value. In addition, the receiver initializes a value of a parameter Itr to 0 (S1202). The parameter Itr is a parameter indicating the number of repetitions. The receiver updates respective check nodes based on values of the variable nodes (S1203). For example, the respective check nodes may be updated based on the values of the variable nodes associated with the respective check nodes by a parity check matrix. The receiver may update the variable nodes (S1204). For example, the receiver may update the respective variable nodes based on values of the check nodes (e.g., LLR values of the check nodes) associated with the variable nodes by the parity check matrix.

The receiver determines whether the value of the parameter Itr is less than a preset maximum value (S1205). If the value of the parameter Itr is less than the maximum value, the receiver may determine whether syndrome check is successful (S1206). For example, the receiver may perform syndrome check for the check nodes using the parity check matrix. For example, syndrome check may be performed according to the method described with reference to FIGS. 9 to 11. If syndrome check is successful, decoding may be regarded as successful. Then, decoding may be ended. However, if syndrome check fails, the receiver may increase the value of the parameter Itr by 1 and repeat steps S1203 to S1205. However, when the number of repetitions reaches the preset maximum value, the receiver may regard decoding as failed. For example, if decoding fails, the receiver may end decoding and transmit negative acknowledgement (NACK) and/or a retransmission request to a transmitter.

To acquire excellent performance of an LDPC code, a parity check matrix (or a generator matrix) may be randomly configured. The performance of the LDPC code may be improved as the length of a block increases. In performing decoding, an optimal decoding method may be used to improve the performance of the LDPC code. However, due to complexity of optimal decoding, the belief propagation algorithm is used to decode the LDPC code. Furthermore, although the randomly generated parity check matrix of the LDPC code has excellent performance, implementation and expression thereof are very complicated. Therefore, the above-described structured LDPC code is widely used. A quasi-cyclic (QC) LDPC (QC-LDPC) code is widely used as the structured LDPC code.

The QC-LDPC code includes a 0 matrix having a size of Q×Q and a circulant permutation matrix (CPM) having a size of Q×Q. The CPM $P^a$ has a type obtained by cyclically shifting a Q×Q identity matrix by a circular shift value a (refer to FIG. 9). For example, as illustrated in FIG. 7, the parity check matrix H may include (mb+1)×(nb+1) CPMs. As described above, the circular shift value 0 represents an identity matrix and the circular shift value −1 represents a 0 matrix. The parity check matrix may be expressed as a matrix of circular shift values as illustrated in FIG. 8. Herein, each circular shift value may be configured to have a value of −1 or more and Q−1 or less. The matrix including circular shift values as illustrated in FIG. 8 may be called a circular shift matrix or a characteristic matrix.

To configure a QC-LDPC code of a desired size, a lifting operation may be performed. Lifting is used to acquire a parity check matrix of a desired size from a preset parity check matrix. Various code lengths may be supported by changing a lifting size. For example, floor lifting or modulo lifting may be used. For example, when Q is 20 and a lifting value Z is 5, the size of information that a generated QC-LDPC may process is 100.

To process the lifting operation, various types of shifting networks may be used. For example, for the QC-LDPC code, an interconnection routing network may be defined by the size of a submatrix and a circular shift value of each of CPMs. For lifting of the QC-LDPC, shift network techniques, which will be described below, may be used.

For example, a single-size circular shifting (SS-CS) network uses a barrel shifter having a data array consisting of only one size Z. The SS-CS network has an arbitrary rotation of 0, 1, . . . , Z−1. The arbitrary rotation of the SS-CS network is decomposed into consecutive rotations of ceil ($\log_2 Z$) by powers of 2. Herein, ceil(X) represents a maximum integer less than X. The SS-CS network requires Z*ceil($\log_2 Z$) multiplexers and ceil($\log_2 Z$) stages.

In addition, for example, a multi-size circular shifting (MS-CS) network may be configured by an SS-CS network array having an arbitrary size merged into an adaptation network. The MS-CS network may include ceil($\log_2 A$)+ceil ($\log_2 Z$) stages of Z*(ceil(Z/A)−1+ceil($\log_2 A$)) multiplexers. Herein, A is the largest common divisor between all block sizes.

In addition, for example, a QC-LDPC shift network (QSN) uses a conventional logarithmic barrel shifter. The QSN may provide circular shifting for any number of inputs, equal to or less than a network size, by using two barrel shifters and a merge network. The QSN requires $Z*(2*\text{ceil}(\log_2 Z)-1)+1$ multiplexers and $\text{ceil}(\log_2 Z)+1$ stages.

Generally, in implementing the LDPC code, a limited number of parity check matrices is used. For example, a plurality of parity check matrices may be generated by lifting at least one elementary matrix. Therefore, the size of a CB may be limited according to the parity check matrices. To raise flexibility of the size of the CB, rate matching may be used. For example, a shortening scheme or a puncturing scheme may be used for rate matching. The shortening scheme may be performed by eliminating a portion of an information part of a codeword. Since a portion of information bits is reduced, a code rate may be reduced by the shortening scheme. The puncturing scheme may be performed by puncturing at least a portion of parities of a codeword. In the case of puncturing, since a ratio of information bits increases, the code rate may increase. Accordingly, theoretically, a codeword corresponding to an arbitrary code rate may be generated by combining shortening and puncturing.

More specifically, in the shortening scheme, the actual length of information bits may be shorter than the length of information bits demanded by a selected parity check matrix. In this case, a preset bit sequence is added to information bits so as to correspond to the length of a parity check matrix. For example, a zero bit sequence may be added to the information bits. A codeword may be generated by encoding the information bit to which the bit sequence is added using the selected parity check matrix. Next, a part corresponding to the added information bits may be eliminated from the codeword.

Hereinafter, a method of segmenting a TB into CBs in an LDPC code will be described. For example, the following embodiments may be performed using various parity check matrices and lifting values. As described above, the shortening scheme may be used to increase flexibility of an information size.

In the following embodiments, for convenience of description, a TB may refer to both a TB and a CRC for a TB. In addition, a CB may refer to both a CB and a CRC for a CB.

Hereinbelow, an information size supported by each parity check matrix may be referred to as $K_i$. For example, a parity check matrix generated by applying a lifting value $Z_i$ to an elementary matrix may support the information size of $K_i$. For example, the parity check matrix may be generated by applying the lifting value $Z_i$ to a parity check matrix having a size of N×M (e.g., elementary matrix). In this case, the information size $K_i$ supported by the generated parity check matrix may be defined as $(M-N)*Z_i$. In the following embodiments, it is assumed that the lifting value and the information size increase as an index i increases. However, the lifting value and the information size may decrease as the index i increases. For example, a parity check matrix for lifting may have a size of 15×31. In addition, lifting values $Z_1$, $Z_2$, $Z_3$, and $Z_4$ may be defined as 300, 320, 340, and 360, respectively. In this case, information sizes $K_1$, $K_2$, $K_3$, and $K_4$ that are supportable by respective parity check matrices may be defined as 4800, 5120, 5440, and 5760, respectively.

In an LTE communication system using a turbo code, CB segmentation may be performed by segmenting each CB into CBs having an equal size. A block error rate (BLER) may be determined based on whether a TB has been successfully received. When all CBs of the TB have been successfully received, the TB may be successfully received.

In addition, as the length of a CB becomes shorter, a probability of successfully receiving the CB is lowered. Accordingly, in order to maximize the length of the CB, the TB is segmented into CBs having an equal size, Segmentation into CBs of an equal size as described above may be applied even to the LDPC code. However, since the size of the parity check matrix is limited as described above, supportable sizes of the CBs are also limited. In the LTE communication system, an interval of a TB size is defined as 8 to 64. Even in recently discussed new radio access technology (RAT), TBs of an equal size may be used. In this case, in order to support TBs of all sizes, parity check matrices of many sizes are demanded. However, an increase in the parity check matrices may cause an increase in implementation complexity. Therefore, the number of parity check matrices or the number of lifting values may be reduced using the above-described shortening scheme.

For example, when a TB of a size $K_{TB}$ is segmented using a supported information size $K_i$, the number of CBs, $N_{CB}$, may be defined as indicated by the following equation.

$$N_{CB} = \left\lceil \frac{K_{TB}}{K_i} \right\rceil \quad \text{[Equation 3]}$$

Accordingly, the number of CBs, $N_{CB}$, may be determined to be a minimum integer exceeding a value obtained by dividing the size of the TB by the supported information size. As described above, as the size of a CB becomes shorter, an error rate may increase. Therefore, the supported information size $K_i$ may be determined such that the number of CBs may become the smallest value. However, when the greatest supported information size is selected to reduce the number of CBs, the length of shortening bits may increase. Accordingly, the supported information size may be determined such that the length of shortening bits may be minimized. In addition, the supported information size for simplifying implementation may be selected. For example, the length of shortening bits may be reduced by selecting the smallest supported information size (i.e., the smallest i). Power consumed to encode/decode information of the same size may be reduced by decreasing the length of shortening bits. For example, the length of shortening bits, $S_i$, may be defined as indicated by the following equation. $S_i$ represents the length of shortening bits demanded when segmentation is performed using the supported information size $K_i$.

$$S_i = N_{CB} \times K_i - K_{TB} \quad \text{[Equation 4]}$$

In addition, the TB may be segmented into CBs of an equal size as indicated by the following equation.

$$\frac{S_i + K_{TB}}{N_{CB}} \quad \text{[Equation 5]}$$

For example, the size of the TB, $K_{TB}$, may be 10300. In addition, supported information sizes $K_1$, $K_2$, $K_3$, and $K_4$ may be defined as 4800, 5120, 5440, and 5760, respectively. According to Equation 3, $N_{CB}$ of a minimum value may be determined to be 2. To minimize the length of shortening bits, i of a minimum value may be determined to be 3. When the supported information size $K_3$ of 5440 is used, the length of shortening bits, $S_3$, may be determined to be 580. Since segmented CBs have the same size, the length of shortening bits, $S_3$, may be equally allocated to two CBs. Therefore, each of CBs generated by a parity check matrix corresponding to $K_3$ includes 290 shortening bits.

Due to limitation of performance or ease of implementation, the length of shortening bits may be limited. In this case, segmentation using CBs of an equal size may not be performed. For example, the length of short bits per CB may be limited to a value less than 200 bits. In the above embodiment, the shortening bits may not be configured as a value less than 200 bits even by the supported information size $K_3$. Then, segmentation may be performed according to the following example.

For example, the number of CBs determined as described above may be maintained. Instead of not changing the number of CBs, the size of one CB may be changed. As an example, if the supported information size Ki is selected as described above, the supported information size of one of segmented CBs may be changed to $K_j$. Herein, j is a value less than i and, in the present embodiment, j may mean a supported information size smaller than the selected supported information size. In this case, the length shortening bits, S, after the size of one CB is changed may be determined according to the following equation.

$$S=(N_{CB}-1)\times K_i+K_j-K_{TB} \qquad \text{[Equation 6]}$$

If the length of shortening bits satisfies a preset limitation, shortening may be performed upon each CB. For example, shortening of an equal size may be performed upon a CB having a size of $K_i$ and a CB having a size of $K_j$. As an example, shortening of $S/N_{CB}$ may be performed upon each CB. In addition, the performance of an entire code may be determined according to the performance of the size of $K_j$ corresponding to the smallest length of a CB. Therefore, shortening of the same size may be performed upon CBs except for the CB having a size of $K_j$. For example, shortening of $S/(N_{CB}-1)$ may be performed upon CBs having a size of $K_i$.

However, the preset limitation may not be satisfied only by reducing the size of one CB. In this case, one or more CBs among CBs of a selected supported information size may be changed to have a supported information size smaller than the selected supported information size. For example, in order to satisfy the shortening limitation, the sizes of m CBs may be changed to $K_j$. In this case, the length of shortening bits, S, may be determined according to the following equation.

$$S=(N_{CB}-m)\times K_i+m\times K_j-K_{TB} \qquad \text{[Equation 7]}$$

According to above-described method, a parity check matrix and/or a lifting value may be selected based on the selected supported information size. Information about the parity check matrix and/or the lifting value used to encode a CB may be transmitted to a receiver. For example, an index of a used elementary matrix, an index of a lifting value, an index of a TB size, and/or an index of a modulation and coding scheme (MCS) may be transmitted to the receiver. In addition, for example, information about the elementary matrix, the lifting value, the TB size, and/or the MCS may be preconfigured between the transmitter and the receiver.

For example, a plurality of parity check matrices supporting the selected supported information size $K_i$ and/or $K_j$ may be present. In this case, in consideration of power demanded to perform encoding/decoding, a parity check matrix having the smallest length of shortening bits may be selected. Alternatively, a parity check matrix that is easy to implement may be selected. For example, when the size of a shortened CB is 3800, $K_i$ is 3900, and $K_{i+1}$ is 4096, $K_{i+1}$ may be selected in consideration of ease of implementation. This is because $K_{i+1}$ may be implemented using a $2^n$ shifting network.

For example, in the above-described embodiment, the length of shortening bits may be limited to 0. In this case, in Equation 4, the length of shortening bits may be set to 0 and $K_i$ satisfying Equation 4 may be selected. However, when shortening bits are demanded even by all supported information lengths, S may be set to 0 in Equation 6 or Equation 7 and then values $K_i$, $K_j$, and m may be determined.

Figure 13:
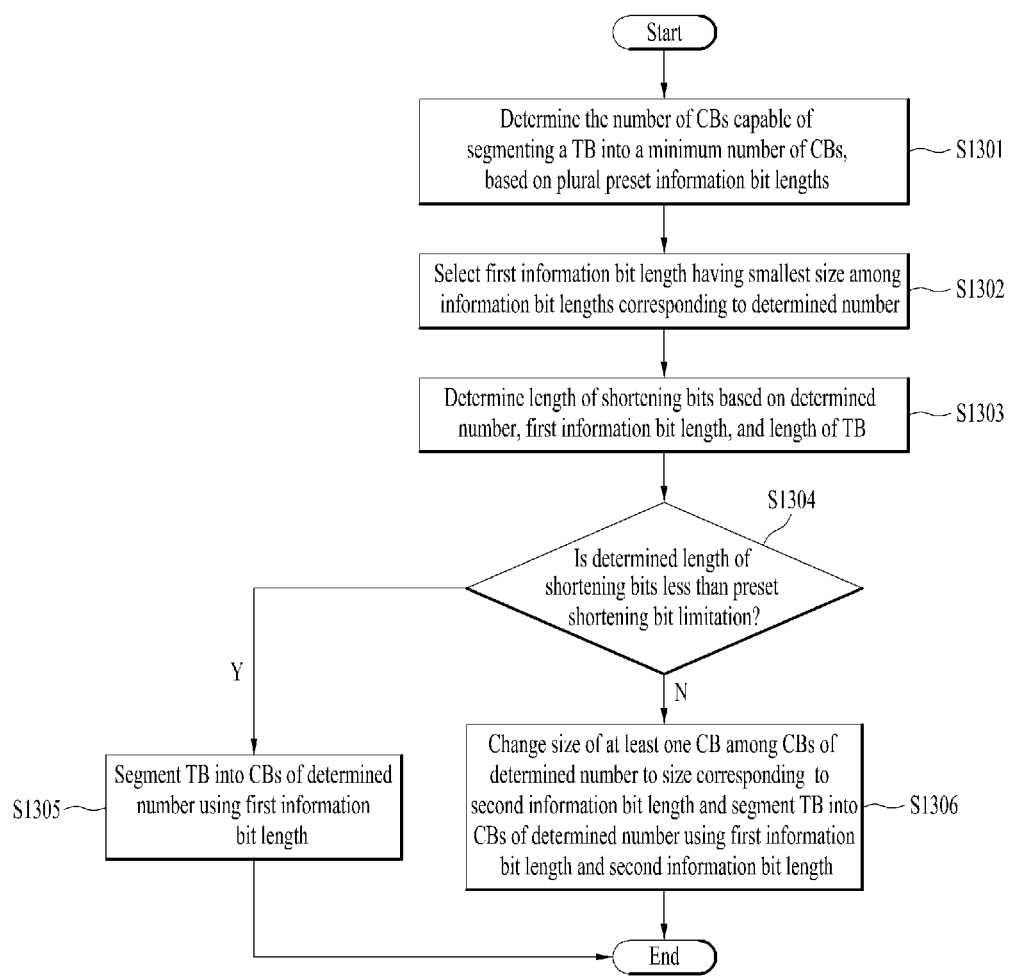
FIG. 13 is a flowchart of an exemplary transport block segmentation method.

FIG. 13 is a flowchart illustrating an exemplary TB segmentation method of an LDPC code.

In an embodiment of FIG. 13, the TB segmentation method may be performed by the transmitter. The transmitter may be, for example, a UE or a BS.

For example, a plurality of supportable information bit lengths may be preset in a transmitter. The information bit length may be determined based on a parity check matrix or a lifting value, and an elementary matrix. The plural information bit lengths may also be determined based on a shifting network of the transmitter. A CB corresponding to each of the plural information bit lengths may include a CB generated by a parity check matrix corresponding to each of the plural information bit lengths and a CRC of the generated CB.

The transmitter may determine the number of CBs capable of segmenting a TB into a minimum number of CBs, based on a plurality of preset information bit lengths (S1301). For example, the transmitter may determine the number of CBs using Equation 3 described above. In addition, as described above, the length of a TB in the present embodiment may be a length including the TB and a CRC for the TB.

The transmitter may select a first information bit length having the smallest size among information bit lengths corresponding to the determined number of CBs (S1302). That is, the first information bit length may be determined to be the smallest value among information bit lengths corresponding to the lengths of CBs of the determined number which are equal to or longer than the length of the TB.

The transmitter may determine the length of shortening bits based on the determined number, the first information bit length, and the length of the TB (S1303). For example, the transmitter may determine the length of shortening bits using Equation 4 described above. The transmitter may determine the length of shortening bits by subtracting the length of the TB from the sum of first information bit lengths of the determined number.

Next, the transmitter may determine whether the determined length of shortening bits is less than a preset shortening bit limitation (S1304). For example, the shortening bit limitation may be defined as the maximum length of shortening bits per CB or the maximum length of shortening bits for an entire TB. The shortening bit limitation may be preset in the transmitter.

If the determined length of shortening bits is less than the preset shortening bit limitation, the transmitter may segment the TB into CBs of the determined number using the first information bit length (S1305). As much shortenings as the determined length of shortening bits may be performed upon the segmented CBs. Shortening may be performed with the same length with respect to all of the segmented CBs.

If the determined length of shorting bits is equal to or longer than the preset shorting bit limitation, the transmitter may change the size of at least one CB among CBs of the determined number to a size corresponding to a second information bit length and segment the TB into CBs of the determined number using the first information bit length and the second information bit length (S1306). Herein, the second information bit length is shorter than the first information bit length among the plural information bit lengths. In this case, the number of CBs corresponding to the second information bit length may be determined such that the length of all changed CBs according to change to the second information bit length is shorter than the preset shortening bit limitation. For example, the number of CBs changed to the second information bit length may be limited. For example, the second information bit length may be determined such that the number of CBs changed to the second information bit length may be minimized.

If the length of at least one CB is changed to a length corresponding to the second information bit length, the transmitter may update the length of shortening bits based on the entire length of the CBs and the length of the TB. In addition, shortening may be performed with the same length with respect to all CBs. Shortening may also be performed only upon a CB corresponding to the first information bit length.

Figure 14:
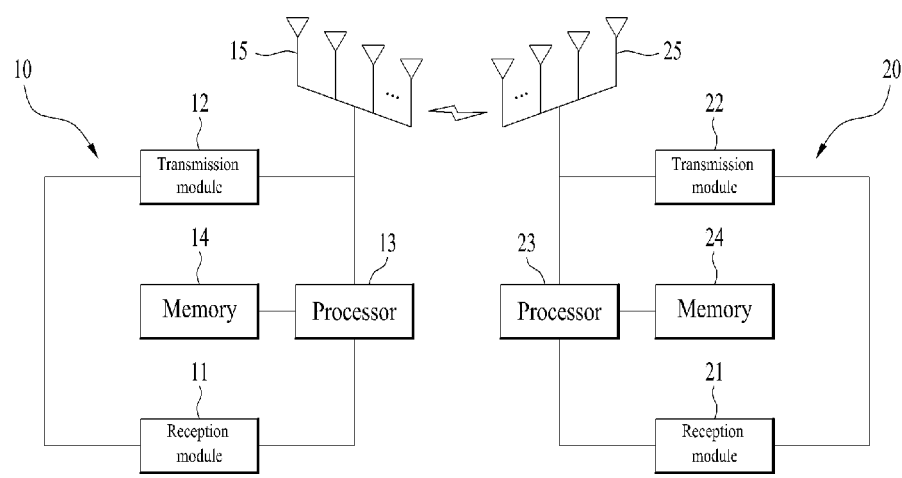
FIG. 14 is a diagram illustrating the configuration of a BS and a UE according to an embodiment of the present invention.

FIG. 14 is a diagram schematically illustrating the configuration of devices to which embodiments of the present invention described in FIGS. 1 to 13 are applicable according to an embodiment of the present invention.

Referring to FIG. 14, a BS 10 according to the present invention may include a reception module 11, a transmission module 12, a processor 13, a memory 14, and a plurality of antennas 15. The transmission module 12 may transmit a variety of signals, data, and information to an external device (e.g., UE). The reception module 11 may receive a variety of signals, data, and information from the external device (e.g., UE). The reception module 11 and the transmission module 12 may be referred to as a transceiver. The processor 13 may control overall operation of the BS 10. The plural antennas 15 may be configured according to, for example, a 2-dimensional antenna arrangement.

The processor 13 of the BS 10 according to an example of the present invention may be configured to receive channel state information according to the examples proposed in the present invention. The processor 13 of the BS 10 processes information received by the BS 10 and information to be transmitted to the outside of the BS 10. The memory 14 may store the processed information for a predetermined time and may be replaced with a component such as a buffer (not shown).

Referring to FIG. 14, a UE 20 according to the present invention may include a reception module 21, a transmission module 22, a processor 23, a memory 24, and a plurality of antennas 25. Use of the plurality of antennas 25 means that the UE 20 supports Multiple Input Multiple Output (MIMO) transmission and reception using the plurality of antennas 25. The transmission module 22 may transmit a variety of signals, data, and information to an external device (e.g., BS). The reception module 21 may receive a variety of signals, data, and information from the external device (e.g., BS). The reception module 21 and the transmission module 22 may be referred to as a transceiver. The processor 23 may control overall operation of the BS 10.

The processor 23 of the UE 10 according to an example of the present invention may be configured to transmit channel state information according to the examples proposed in the present invention. The processor 23 of the UE 20 processes information received by the UE 20 and information to be transmitted to the outside of the UE 10. The memory 24 may store the processed information for a predetermined time and may be replaced with a component such as a buffer (not shown).

The detailed configurations of the UE 10 may be implemented such that the above-described various embodiments of the present invention are independently applied or two or more embodiments of the present invention are simultaneously applied. Redundant matters will not be described herein for clarity.

In described various embodiments of the present invention, while the BS has been mainly described as an example of a downlink transmission entity or an uplink reception entity and the UE has been mainly described as an example of a downlink reception entity or an uplink transmission entity, the scope of the present invention is not limited thereto. For example, a description of the BS may be identically applied when a cell, an antenna port, an antenna port group, a remote radio head (RRH), a transmission point, a reception point, an access point, or a relay is a downlink transmission entity to the UE or an uplink reception entity from the UE. In addition, the principle of the present invention described through various embodiments of the present invention may be identically applied to a relay acting as a downlink transmission entity to the UE or an uplink reception entity from the UE, or a relay acting as an uplink transmission entity to the BS or a downlink reception entity from the BS.

The embodiments of the present invention may be implemented by various means, for example, hardware, firmware, software, or a combination thereof.

In a hardware configuration, the method according to the embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, or microprocessors.

In a firmware or software configuration, the method according to the embodiments of the present invention may be implemented in the form of modules, procedures, functions, etc. performing the above-described functions or operations. Software code may be stored in a memory unit and executed by a processor. The memory unit may be located at the interior or exterior of the processor and may transmit and receive data to and from the processor via various known means.

The embodiments described above are combinations of components and features of the present invention in a prescribed form. Each component or feature may be considered selective unless explicitly mentioned otherwise. Each component or feature may be executed in a form that is not combined with other components and features. Further, some components and/or features may be combined to configure an embodiment of the present invention. The order of operations described in the embodiments of the present invention may be changed. Some components or features of an embodiment may be included in another embodiment or may be substituted with a corresponding component or feature of the present invention. It is obvious to those skilled in the art that claims that are not explicitly cited in each other in the appended claims may be presented in combination as an embodiment of the present invention or included as a new claim by subsequent amendment after the application is filed.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all changes which come within the equivalent scope of the invention are within the scope of the invention.

INDUSTRIAL APPLICABILITY

The embodiments of the present invention are applicable to various wireless access systems and broadcast communication systems. The wireless access systems include, for example, a 3GPP system, a 3GPP2 system, and/or an IEEE 802.xx system. The embodiments of the present invention may be applied not only to the wireless access systems but also to all technical fields employing the wireless access systems.

The invention claimed is:

1. A method of segmenting a transport block of a low-density parity-check (LDPC) code by a user equipment (UE), the method comprising:
   determining a smallest number that can divide the first block into the second blocks based on the plurality of information bit lengths;
   selecting a first information bit length of a smallest one of the information bit lengths capable of dividing the first block by the determined number;
   determining the length of the shortening bits based on the determined number, the first information bit length, and the length of the first block;
   determining whether the determined length of the shortening bits is less than a preset shortening bit limitation;
   if the determined length of shortening bits is shorter than the preset shortening bit limitation, segmenting the first block into the second blocks of the determined number, using the first information bit length; and
   if the determined length of the shortening bits is equal to or longer than the preset shortening bit limitation, segmenting the first block into the second blocks of the determined number, using the first information bit length and the second information bit length, by changing at least one second block among the second blocks to a size corresponding to a second information bit length among the plural information bit lengths,
   wherein the first block corresponds to the transport block, the second block corresponds to the code block, and the second information bit length is shorter than the first information bit length.

2. The method of claim 1,
   further comprising, if the determined length of the shortening bits is shorter than the present shortening bit limitation, performing shortening of an equal size upon each of the second blocks, based on the determined length of the shortening bits.

3. The method of claim 1,
   further comprising, if the determined length of the shortening bits is equal to or longer than the preset shortening bit limitation, performing shortening of an equal size only upon second blocks corresponding to the first information bit size, based on the determined length of the shortening bits.

4. The method of claim 1,
   wherein the plural information bit lengths are determined based on different parity check matrices.

5. The method of claim 1,
   wherein the first block includes the transport block and a cyclic redundancy check (CRC) for the transport block, and
   the second block includes the code block and a CRC for the code block.

6. A user equipment (UE) of a wireless communication system, the UE comprising:
   a transceiver configured to transmit and receive a signal;
   a memory; and
   a processor configured to control the transceiver and the memory,
   wherein the processor is configured to:
   determine a smallest number that can divide the first block into the second blocks based on the plurality of information bit lengths;
   select a first information bit length of a smallest one of the information bit lengths capable of dividing the first block by the determined number;
   determine the length of the shortening bits based on the determined number, the first information bit length, and the length of the first block;
   determine whether the determined length of the shortening bits is less than a preset shortening bit limitation;
   segment the first block into the second blocks of the determined number, using the first information bit length, if the determined length of shortening bits is shorter than the preset shortening bit limitation, and
   segment the first block into the second blocks of the determined number, using the first information bit length and the second information bit length, by changing at least one second block among the second blocks to a size corresponding to a second information bit length among the plural information bit lengths, if the determined length of the shortening bits is equal to or longer than the preset shortening bit limitation,
   wherein the first block corresponds to the transport block,
   wherein the second block corresponds to the code block, and
   wherein the second information bit length is shorter than the first information bit length.

7. The UE of claim 6,
   wherein, if the determined length of the shortening bits is shorter than the present shortening bit limitation, shortening of an equal size is performed upon each of the second blocks, based on the determined length of the shortening bits.

8. The UE of claim 6,
   wherein, if the determined length of the shortening bits is equal to or longer than the preset shortening bit limitation, shortening of an equal size is performed only upon second blocks corresponding to the first information bit size, based on the determined length of the shortening bits.

9. The UE of claim 6,
   wherein the plural information bit lengths are determined based on different parity check matrices.

10. The UE of claim 6,
    wherein the first block includes the transport block and a cyclic redundancy check (CRC) for the transport block, and
    the second block includes the code block and a CRC for the code block.

* * * * *